United States Patent [11] 3,568,011

United States Patent

[11] 3,568,011

[72] Inventor Minetaka Iwasa
Tokyo, Japan
[21] Appl. No. 732,627
[22] Filed May 28, 1968
[45] Patented Mar. 2, 1971
[73] Assignee Nippon Electric Company, Limited
Tokyo, Japan

[54] SEMICONDUCTOR DEVICE INCLUDING A METAL LAYER OVERLYING THE JUNCTION AREA
4 Claims, 11 Drawing Figs.

[52] U.S. Cl. 317/234, 307/299
[51] Int. Cl. H01l 9/00
[50] Field of Search 317/234, 235; 317/235/7, 235/31; 317/235/71

[56] References Cited
UNITED STATES PATENTS

| | | | |
|---|---|---|---|
| 3,397,450 | 8/1968 | Bittmann et al. | 29/578 |
| 2,842,723 | 7/1958 | Koch et al. | 317/235 |
| 3,166,448 | 1/1965 | Hubner | 317/235 |
| 3,252,003 | 5/1966 | Schmidt | 317/235 |

*Primary Examiner*—Jerry D. Craig
*Attorney*—Hopgood and Calimafde

ABSTRACT: A high speed high current switching device is described wherein a metal-to-semiconductor rectifier element is selectively placed within the sphere of influence of a spatially variable space charge region of a semiconductor junction formed between semiconductor materials of opposite conductivity. Several embodiments are described.

INVENTOR.
MINETAKA IWASA
BY
Hopgood & Calimafde
ATTORNEYS

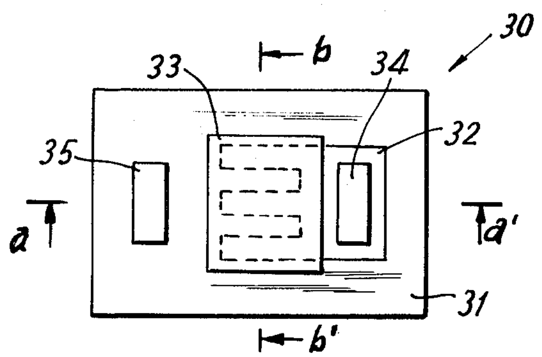
FIG. 3A
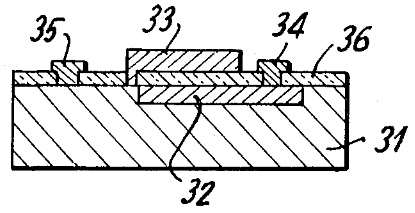
FIG. 3B
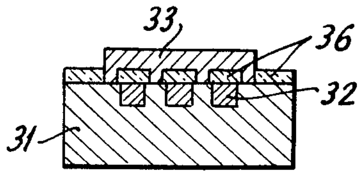
FIG. 3C
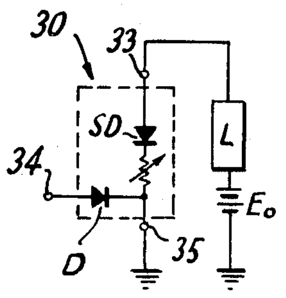
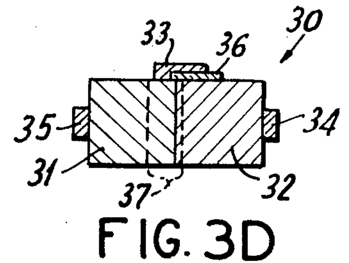
FIG. 3D
FIG. 3E
INVENTOR.
MINETAKA IWASA
BY
Hopgood & Calimafde
ATTORNEYS

SEMICONDUCTOR DEVICE INCLUDING A METAL LAYER OVERLYING THE JUNCTION AREA

Transistors, thyristors and other semiconductor devices have hitherto been used for current control. These conventional semiconductor switching elements utilize the property of minority carrier accompanied by the so-called storing effect. Due to the storing effect, recombination of the injected minority carriers takes a long time (recombination time). For this reason, these conventional semiconductor switching elements are not suitable for high-speed current control.

It is therefore the object of this invention to provide a semiconductor device suitable for high-speed current control.

The above-mentioned and other features and objects of this invention and the manner of attaining them will become more apparent and the invention itself will best be understood by reference to the following description of embodiments of the invention taken in conjunction with the accompanying drawings, wherein.

Figure 2A:
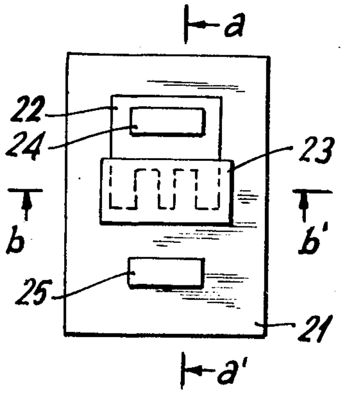
Figure 2B:
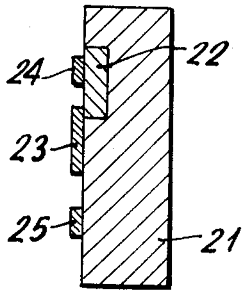
Figure 2C:
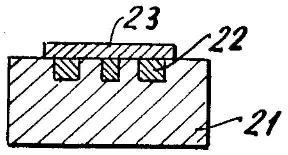

FIGS. 2A through C are respectively a plan view and cross-sectional views of another embodiment of this invention;

FIGS. 3A through 3D are respectively a plan view and cross-sectional views of still another embodiment of this invention; and FIG. 3E is the equivalent circuit of the last-mentioned embodiment.

According to this invention, a novel semiconductor device is provided which comprises a semiconductor element having P and N regions forming therebetween a PN junction; separate ohmic contact electrodes are attached to the respective semiconductor regions; and a metal layer bonded to at least one of the regions and near to the plane of the PN junction, which layer extends over the side surface of the P and/or N regions within the range of the space charge layer of the PN junction and which layer contributes to the rectifier property observed between itself and at least one of the P and N regions.

As is known, when a metal comes in contact with a semiconductor material which contains an impurity concentration lower than a certain value, the Schottky barrier is formed thereby, without regard to the difference in conductivity types of the regions. Due to the Schottky barrier the current-voltage characteristic becomes nonlinear and a rectifying effect is brought forth. When a Schottky barrier is formed in a region located within the range of the spatial variation of the space charge layer (this spacial variation being produced by a reversing of the bias voltage of the PN junctions), the forward current flowing through the Schottky barrier may be controlled by the bias voltage applied across the PN junction.

In the semiconductor device according to this invention, a metal layer bonded thereto is used to form the Schottky barrier or stated otherwise one of the P and N regions brings forth the rectifying effect between itself and the metal layer. Also, the metal layer is selectively disposed within or beyond the breadth of the spacing of the space charge layer of a PN junction formed between the P and N regions. Therefore, by varying the biasing voltage applied across the P and N regions, the breadth of the space charge layer is controlled and thus enables us to control the current flowing through the Schottky barrier.

Since the forward current flowing through the Schottky barrier is caused by the majority carrier, the restoring time inside the semiconductor is remarkably short compared with conventional semiconductor current control devices. Thus, extremely high-speed current control can be realized in the present device, when the PN junction biasing voltage is set at an appropriate value.

The invention will now be more specifically explained by referring to the appended drawings.

Figure 1A:
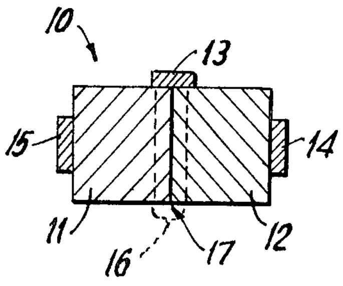
FIG. 1A is a longitudinal cross-sectional view of one embodiment of this invention.
Figure 1B:
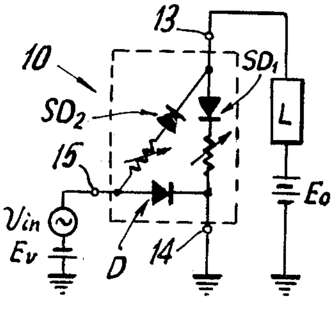
FIGS. 1B and 1C are equivalent circuits of the embodiment.
Figure 1C:
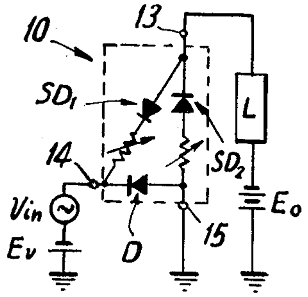

In the embodiment of FIG. 1A, a metal layer or electrode 13 is bonded to the PN junction 17 of a P-type region 11 and an N-type region 12. The layer 13 is perpendicular to the plane of the junction 17 so that it may bring forth the rectifying effect between itself and each of the P-type and N-type regions 11 and 12. On the far end surfaces of these regions 11 and 12, metal electrodes 14 and 15 are bonded to form ohmic contacts. The semiconductor device 10 is expressed by an equivalent circuit shown FIG. 1B or FIG. 1C, when viewed from an electrical point of view and with respect to the electrodes 13, 14 and 15. The equivalent circuit of FIG. 1B illustrates the device 10 as connected to an input signal source, an output load and biasing voltage sources. As will be readily understood from the drawing, the biassing voltage is applied in this case to maintain the electrode 14 at a voltage higher by $E_r$ that the electrode 15. The input control voltage source is connected to the electrode 13 in series with the bias voltage source. The output load L is connected to the other electrode 13 in series with another bias voltage source. In the equivalent circuit of FIG. 1C, the polarity of bias voltage source is reversed. The polarity of each of the diodes in the block 10 is reversed accordingly.

Upon application of a reverse bias voltage across the PN junction 17, the space charge layers 16 are formed. Since the spatial position of each of the layers 16 is varied by a change in the reverse voltage, the forward current flowing through the electrodes 13 and 14 (in the case of the equivalent circuit of FIG. 1B or through the electrode 13 and 15 (in the case of the equivalent circuit of FIG. 1C can be controlled in response to the bias voltage $V_{in}$.

Using silicon as the semiconductor material for regions 11 and 12, the electrode 13 may be made of molybdenum, tungsten, chromium, platinum silicide or the like. These materials are suitable for forming the Schottky barrier with the silicon substrate. The electrode 14 and 15 may be aluminum, gold-gallium alloy to the P-type silicon and gold-antimony alloy to the N-type silicon each suitable for forming ohmic contact. As is known, the ohmic contact can be readily formed between a metal of any kind and a semiconductor material if the semiconductor has high impurity concentration. Therefore if the highly impurity-concentrated region is formed beneath the electrodes 14 and 15 in advance, all the electrodes 13, 14 and 15 can be made of the same material.

Referring again to FIG. 1A, the width of metal electrode 13 should be decided by taking the required characteristics into consideration. In this respect, attention should be directed to the following points.

When the width of the electrode 13 is larger than the maximum spacing of the space charge layers 16, the forward current flowing from the electrode 13 to the electrode 14 in FIG. 1B through the Schottky barrier $SD_1$ is decreased only slightly even if a reverse bias is applied across the PN junction 17. In contrast, when the layer 13 width is not larger than the spacing of the space charge layer 16, the forward current may be perfectly switched off by a reversing of the bias voltage.

Another embodiment shown in FIGS. 2A, 2B and 2C is the device adapted to control large currents. A metal electrode 23 is bonded to the surface of the semiconductor substrate to cover a consecutive square U-shaped PN junction portion. As in the case of the first embodiment, the electrode 23 should form a rectifying element between itself and both of the P and N regions 21 and 22. Electrodes 24 and 25 are ohmic contact electrodes formed over the semiconductor regions 24 and 25, respectively. In this embodiment, the portion of the metal layer 23 in perpendicular contact with the PN junction can be made long, thereby permitting control of a large current. In addition to this feature, the electrode 23 can be made sufficiently wide, because the spatial interval of the consecutive square U-junctions can be narrowed to the extent that it becomes twice as wide as the spacing of the space charge layer. Furthermore, the method of forming the electrode 23 is simplified by making the electrode 23 comparable to the area involving the consecutive square U-shaped junction of the region 22.

In still another embodiment of FIGS. 3A through 3E, a comb-shape P-type region 32 is covered by an insulating film 36, onto which an electrode 33 is mounted. In this embodiment, the electrode 33 is, therefore, in contact with the N-type region 31 forming the rectifier element therebetween and insulated from the P-type region 32 by the insulating film 36. Other arrangements made for this embodiment are the same as those in the case of FIGS. 2A to 2C.

This embodiment has the advantage that a high impurity-concentrated region is possible for the P-type region 32 because an ohmic contact between the region 32 and the electrode 33 is prevented by the insulating layer 36 therebetween. Owing to this P-type concentrated region, the space charge layer 37 can be mainly extended toward the N-type region whose impurity concentration is not so high as the region 32. Referring to the equivalent circuit of FIG. 3E, the device 30 of this embodiment comprises one Schottky barrier diode formed between the electrodes 33 and 35, and one PN junction diode between the electrodes 34 and 35. As will be apparent from the drawing, the device 30 makes it possible to control the current flowing in the output load L in response to the bias voltage applied to the electrode 34.

While the invention has been described in conjunction with several embodiments, it should be understood that these embodiments are mentioned by way of example and not as a limitation to the scope of the invention and that the invention covers all semiconductor devices as defined by the appended claims.

I claim:

1. A semiconductor device comprising:
a body of semiconductor material;
a first region of a first conductivity type in said body;
an electrode connected to said first region;
a second region of a second conductivity type in said body forming a PN junction with said first region intersecting the surfaces of said body;
a second electrode coupled to said second region;
means for applying a bias voltage between said electrodes for developing a space charge region at said junction; and
a metal layer disposed on the surface of said device straddling said junction and having a rectifying contact with each of said regions, said metal layer extending on both sides of said junction into said space charge region.

2. The device as recited in claim 1 wherein said semiconductor material second region is formed in substantial coplanar relationship within the first region to establish a semiconductor junction which intersects the common coplanar surface of the regions and wherein the metal layer is sized to cover a selected area on said common surface opposite the intersection thereof by the junction.

3. The device as recited in claim 2 wherein the second region is so shaped to form a junction which intersects the surface in a U-shaped form to increase the current controllable by the metal layer opposite the U-shaped junction.

4. The device as recited in claim 3 wherein said junction intersects the common surface in a comb-shaped pattern with the metal layer opposite the comb.